US010489962B1

United States Patent
Clark et al.

(10) Patent No.: US 10,489,962 B1
(45) Date of Patent: *Nov. 26, 2019

(54) HYBRID HIERARCHY OF BOUNDING AND GRID STRUCTURES FOR RAY TRACING

(71) Applicant: Imagination Technologies Limited, Kings Langley (GB)

(72) Inventors: Gregory Clark, Hemel Hempstead (GB); John W. Howson, St. Albans (GB); Justin DeCell, San Francisco, CA (US); Steven J. Clohset, San Francisco, CA (US)

(73) Assignee: Imagination Technologies Limited, Kings Langley (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/529,279

(22) Filed: Aug. 1, 2019

Related U.S. Application Data

(63) Continuation of application No. 15/649,409, filed on Jul. 13, 2017.

(51) Int. Cl.
*G06T 15/06* (2011.01)
*G06T 17/00* (2006.01)
*G06F 17/50* (2006.01)

(52) U.S. Cl.
CPC ............ *G06T 15/06* (2013.01); *G06F 17/505* (2013.01); *G06T 17/005* (2013.01);
(Continued)

(58) Field of Classification Search
None
See application file for complete search history.

(56) References Cited

U.S. PATENT DOCUMENTS 7,012,604 B1 *  3/2006  Christie .................. G06T 15/06
                                                  345/426
8,717,357 B2     5/2014  McCombe et al.
(Continued)

OTHER PUBLICATIONS

Choi, B., Komuravelli, R., Lu, V., Sung, H., Bocchino, R., Adve, S., Hart, J., Parallel SAH k-D Tree Construction, Jun. 2010, Proceedings of the Conference on High Performance Graphics 2010, pp. 77-86. (Year: 2010).*

Collison et al., "Caching Architecture for Flexible FPGA Ray Tracing Platform," J. Parallel Distrib. Comput., vol. 104, pp. 61-72, Jan. 2017.

(Continued)

*Primary Examiner* — Said Broome
(74) *Attorney, Agent, or Firm* — Vorys, Sater, Seymour and Pease LLP; Vincent M DeLuca

(57) ABSTRACT

Methods and ray tracing units are provided for performing intersection testing for use in rendering an image of a 3-D scene. A hierarchical acceleration structure may be traversed by: traversing one or more upper levels of nodes of the hierarchical acceleration structure according to a first traversal technique, the first traversal technique being a depth-first traversal technique; and traversing one or more lower levels of nodes of the hierarchical acceleration structure according to a second traversal technique, the second traversal technique not being a depth-first traversal technique. Results of traversing the hierarchical acceleration structure are used for rendering the image of the 3-D scene. The upper levels of the acceleration structure may be defined according to a spatial subdivision structure, whereas the lower levels of the acceleration structure may be defined according to a bounding volume structure.

20 Claims, 9 Drawing Sheets

(52) U.S. Cl.
CPC ...... *G06T 2210/12* (2013.01); *G06T 2210/21* (2013.01); *G06T 2210/52* (2013.01)

(56) References Cited

U.S. PATENT DOCUMENTS

| | | |
|---|---|---|
| 9,367,949 B2 | 6/2016 | Lee et al. |
| 2004/0098566 A1* | 5/2004 | Farrell .................. G06F 9/3802 712/214 |
| 2008/0079731 A1* | 4/2008 | Shearer .................. G06T 15/005 345/473 |
| 2008/0129734 A1 | 6/2008 | Nam et al. |
| 2013/0016109 A1 | 1/2013 | Garanzha |
| 2017/0060958 A1 | 3/2017 | Van Rest et al. |
| 2017/0116774 A1 | 4/2017 | Shin et al. |

OTHER PUBLICATIONS

Fu et al., QR-Tree: A Hybrid Spatial Index Structure, Proceedings of the 2nd International Conference on Machine Learning and Cybernetics, vol. 1, Nov. 2, 2003, pp. 459-463.

Hegde et al., "Treeology: A Benchmark Suite for Tree Traversals," 2017 IEEE Int'l Symposium on Performance Analysis of Systems and Software, pp. 227-237, Apr. 2017.

Nam et al., "Parallel Tree Traversal for Nearest Neighbor Query on the GPU," Proceedings of the 45th International Conference on Parallel Processing, Aug. 16, 2016, pp. 113-122.

Vinkler et al., "Bounding Volume Hierarchies versus Kd-trees on Contemporary Many-Core Architectures," Computer Graphics, ACM May 28, 2014, pp. 29-36.

Amanatides et al., "A Fast Voxel Traversal Algorithm for Ray Tracing," Proceedings of EuroGraphics '87, Aug. 1987.

Sung, "A DDA Octree Traversal Algorithm for Ray Tracing," Proceedings of EuroGraphics '91, pp. 73-85, 1991.

Choi et al., "Parallel SAH k-D Tree Construction," High Performance Graphics, The Eurographics Association (2010), pp. 77-86.

* cited by examiner

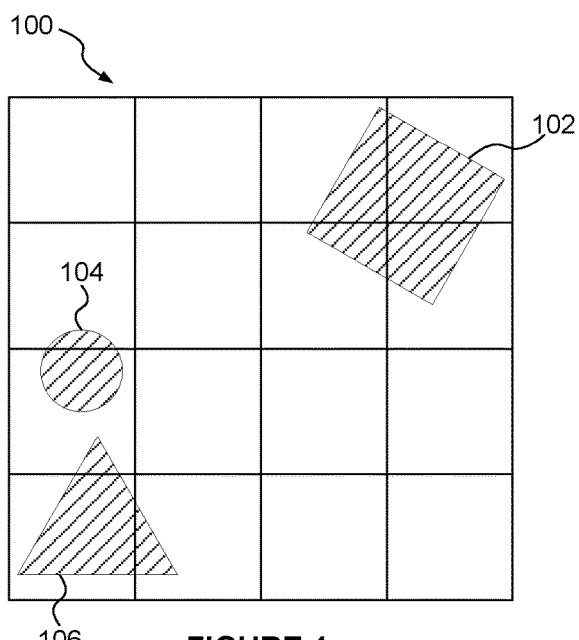
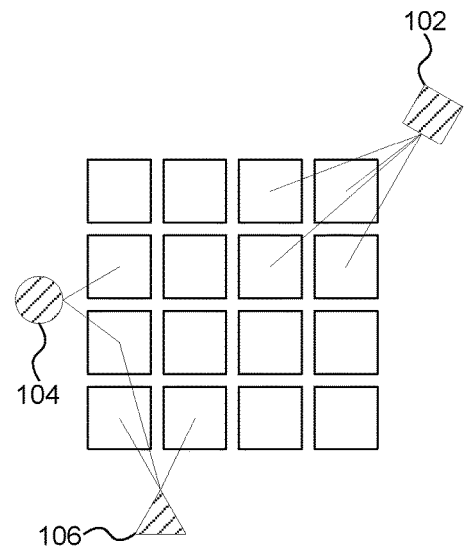
FIGURE 1a
FIGURE 1b
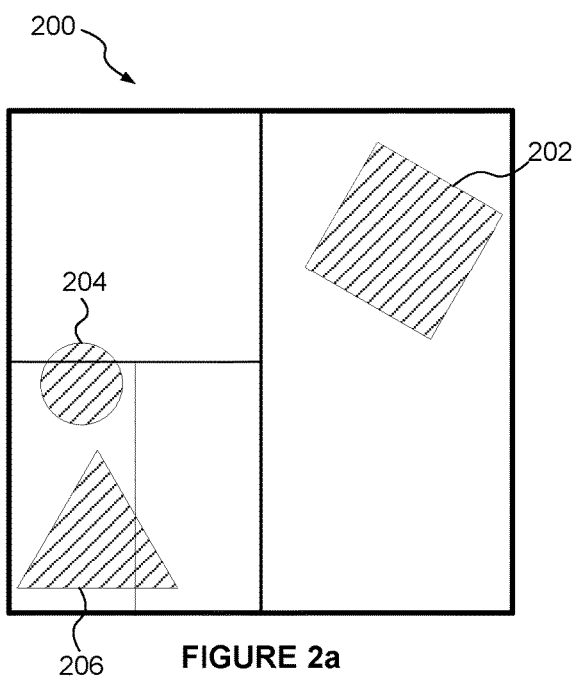
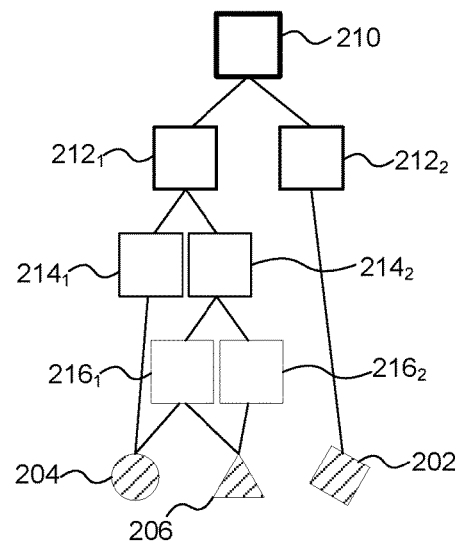
FIGURE 2a
FIGURE 2b

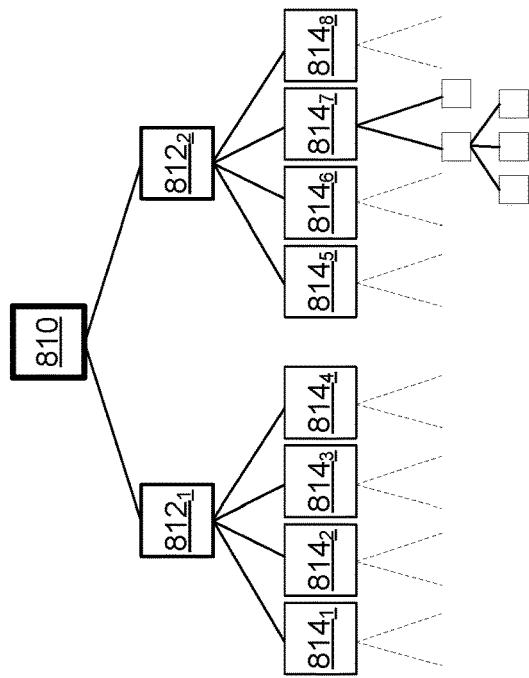
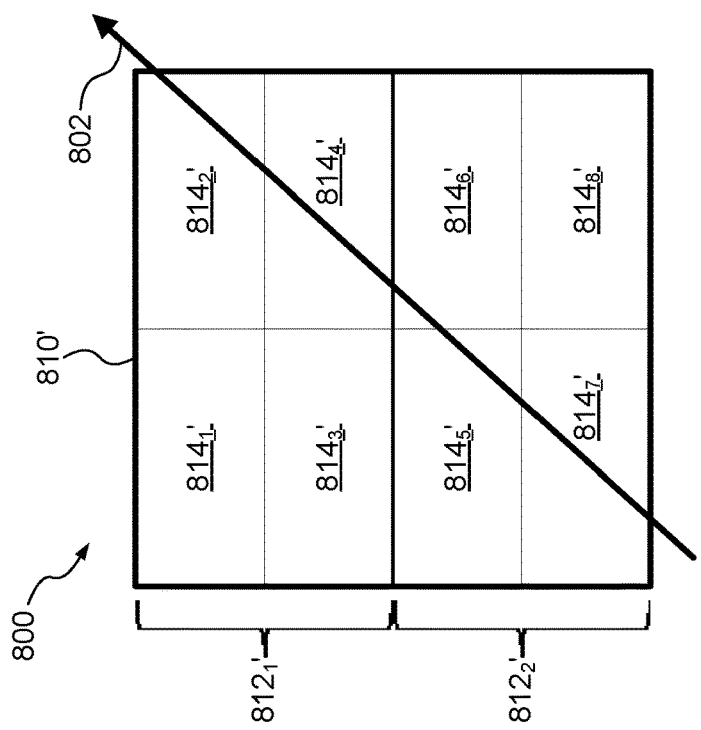
FIGURE 8b
FIGURE 8a

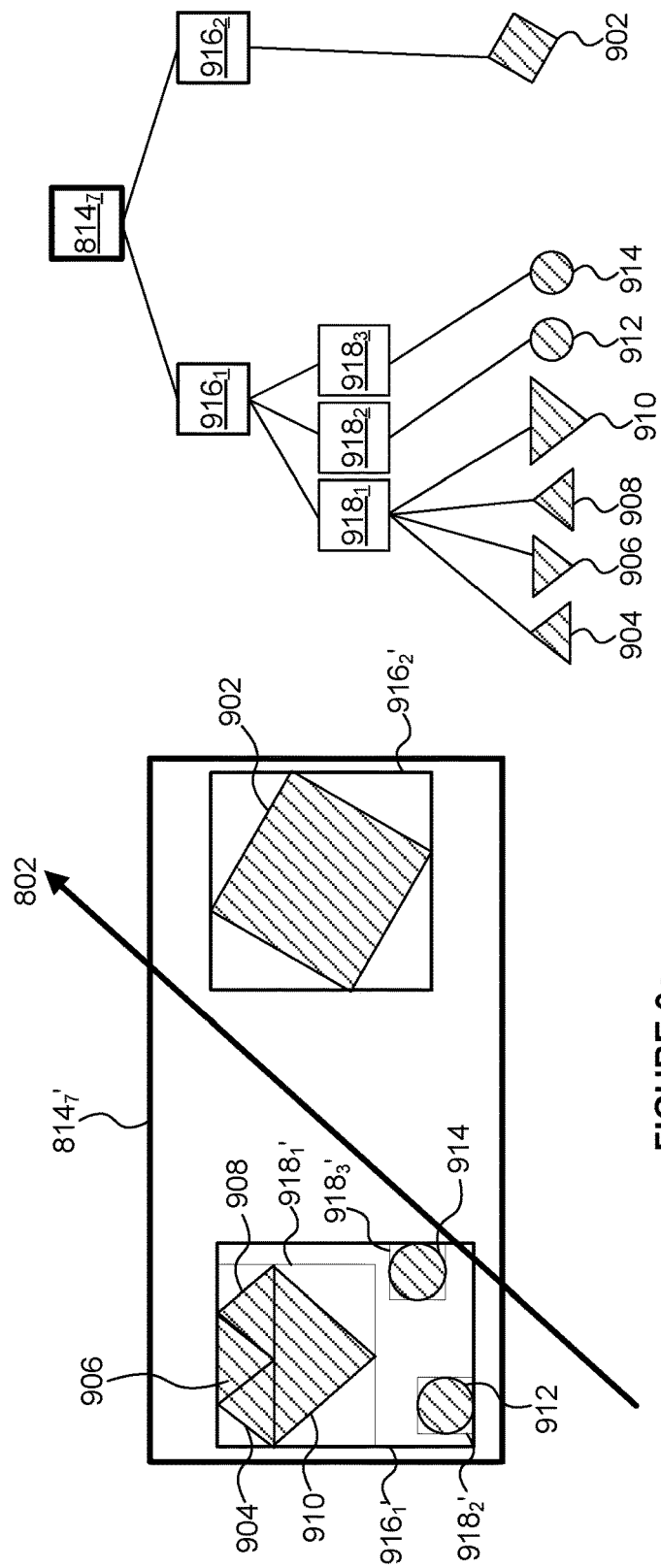

HYBRID HIERARCHY OF BOUNDING AND GRID STRUCTURES FOR RAY TRACING

CROSS-REFERENCE TO RELATED APPLICATIONS AND CLAIM OF PRIORITY

This application is a continuation under 35 U.S.C. 120 of copending application Ser. No. 15/649,409, filed Jul. 13, 2017.

BACKGROUND

Ray tracing systems can simulate the manner in which rays (e.g. rays of light) interact with a scene. For example, ray tracing techniques can be used in graphics rendering systems which are configured to produce images from 3-D scene descriptions. The images can be photorealistic, or achieve other objectives. For example, animated movies can be produced using 3-D rendering techniques. The description of a 3-D scene typically comprises data defining geometry in the scene. This geometry data is typically defined in terms of primitives, which are often triangular primitives, but can sometimes be other shapes such as other polygons, lines or points.

Ray tracing mimics the natural interaction of light with objects in a scene, and sophisticated rendering features can naturally arise from ray tracing a 3-D scene. Ray tracing can be parallelized relatively easily on a pixel by pixel level because pixels generally are independent of each other. However, it is difficult to pipeline the processing involved in ray tracing because of the distributed and disparate positions and directions of travel of the rays in the 3-D scene, in situations such as ambient occlusion, reflections, caustics, and so on. Ray tracing allows for realistic images to be rendered but often requires high levels of processing power and large working memories, such that ray tracing can be difficult to implement for rendering images in real-time (e.g. for use with gaming applications), particularly on devices which may have tight constraints on silicon area, cost and power consumption, such as on mobile devices (e.g. smart phones, tablets, laptops, etc.).

At a very broad level, ray tracing involves: (i) identifying intersections between rays and geometry (e.g. primitives) in the scene, and (ii) performing some processing (e.g. by executing a shader program) in response to identifying an intersection to determine how the intersection contributes to the image being rendered. The execution of a shader program may cause further rays to be emitted into the scene. These further rays may be referred to as "secondary rays".

A lot of processing is involved in identifying intersections between rays and geometry in the scene. In a very naïve approach, every ray could be tested against every primitive in a scene and then when all of the intersection hits have been determined, the closest of the intersections could be identified. This approach is not feasible to implement for scenes which may have millions or billions of primitives, where the number of rays to be processed may also be millions. So, ray tracing systems typically use an acceleration structure which characterises the geometry in the scene in a manner which can reduce the work needed for intersection testing. However, even with current state of the art acceleration structures it is difficult to perform intersection testing at a rate that is suitable for rendering images in real-time (e.g. for use with gaming applications), particularly on devices which have tight constraints on silicon area, cost and power consumption, such as on mobile devices (e.g. smart phones, tablets, laptops, etc.).

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

There is provided a computer-implemented method of performing intersection testing in a ray tracing system for use in rendering an image of a 3-D scene, the method comprising:
    traversing a hierarchical acceleration structure by:
        traversing one or more upper levels of nodes of the hierarchical acceleration structure according to a first traversal technique, said first traversal technique being a depth-first traversal technique; and
        traversing one or more lower levels of nodes of the hierarchical acceleration structure according to a second traversal technique, said second traversal technique not being a depth-first traversal technique;
    wherein results of said traversing the hierarchical acceleration structure are used for rendering the image of the 3-D scene.

There is provided a ray tracing unit configured to perform intersection testing for use in rendering an image of a 3-D scene, the ray tracing unit comprising:
    intersection testing logic configured to access a hierarchical acceleration structure and to traverse the hierarchical acceleration structure by:
        traversing one or more upper levels of nodes of the hierarchical acceleration structure according to a first traversal technique, said first traversal technique being based on a depth-first traversal technique; and
        traversing one or more lower levels of nodes of the hierarchical acceleration structure according to a second traversal technique, said second traversal technique not being a depth-first traversal technique; and
    processing logic configured to use results of traversing the hierarchical acceleration structure for rendering the image of the 3-D scene.

The second traversal technique may be based on a breadth-first traversal technique, wherein intersection testing of nodes with rays is scheduled based on availability of node data and ray data (e.g. using a scheduling scheme). For example, the one or more lower levels of nodes of the hierarchical acceleration structure may be traversed according to the second traversal technique by gathering intersection testing work items together into collections to be executed in parallel, wherein an intersection testing work item identifies a ray and a node which are to be tested for intersection, and wherein collections of work items are scheduled to be executed based on the numbers of work items in the collections.

The traversal of the one or more upper levels of nodes of the hierarchical acceleration structure according to the depth-first traversal technique may comprise using a metric to determine an order in which to descend nodes of the hierarchical acceleration structure. The metric may comprise: (i) a distance metric component, wherein the distance metric component is arranged to cause closer nodes to be descended before more distant nodes; (ii) an occlusion metric component, wherein the occlusion metric component is arranged to cause nodes with more occluding geometry to be descended before nodes with less occluding geometry; (iii) an intersection length metric component, wherein the intersection length metric component is arranged to cause nodes with which a ray has a longer intersection interval to be descended before nodes with which the ray has a shorter intersection interval (where the intersection interval for a ray and a node is the distance between the point at which the ray enters the volume represented by the node and the point at which the ray exits the volume); and/or (iv) a previous intersection metric component, wherein indications of the number of intersections are stored for different nodes of the one or more upper levels, and wherein the previous intersection metric component is arranged to cause, based on said indications, nodes with a greater number of intersections to be descended before nodes with a lower number of intersections.

The one or more upper levels of nodes of the hierarchical acceleration structure may be defined according to a first structure, and the one or more lower levels of nodes of the hierarchical acceleration structure may be defined according to a second structure, wherein the first structure is different to the second structure.

The one or more upper levels of nodes of the hierarchical acceleration structure may be defined according to a spatial subdivision structure, such as: (i) a grid structure, (ii) a multi-level grid structure, (iii) an octree structure, or (iv) a space partitioning structure (e.g. a k-d tree).

The one or more lower levels of nodes of the hierarchical acceleration structure may be defined according to a bounding volume structure. The bounding volume structure may be defined with reference to an octree structure.

The number of upper levels of nodes which are traversed according to the depth-first traversal technique may be predetermined. Alternatively, an indication of the number of upper levels of nodes which are to be traversed according to the depth-first traversal technique may be retrieved from a store, wherein the indication is determined when the hierarchical acceleration structure is built, and is stored in the store.

There is provided a computer-implemented method of generating a hierarchical acceleration structure to be used for intersection testing in a ray tracing system, the method comprising:

receiving primitive data for primitives located in a 3-D scene;

determining nodes of the hierarchical acceleration structure based on the received primitive data, wherein one or more upper levels of nodes of the hierarchical acceleration structure are defined according to a spatial subdivision structure, and wherein one or more lower levels of nodes of the hierarchical acceleration structure are defined according to a bounding volume structure; and storing the hierarchical acceleration structure for use in intersection testing.

There is provided a processing module configured to generate a hierarchical acceleration structure to be used for intersection testing in a ray tracing system, the processing module comprising:

an input configured to receive primitive data for primitives located in a 3-D scene; and acceleration structure building logic configured to determine nodes of the hierarchical acceleration structure based on the received primitive data, wherein one or more upper levels of nodes of the hierarchical acceleration structure are defined according to a spatial subdivision structure, and wherein one or more lower levels of nodes of the hierarchical acceleration structure are defined according to a bounding volume structure;

wherein the processing module is configured to cause the hierarchical acceleration structure to be stored for use in intersection testing.

The nodes of the hierarchical acceleration structure may represent volumetric elements within the 3-D scene, wherein primitive indications may be stored for leaf nodes of the hierarchical acceleration structure to indicate primitives which are present within the volumetric elements corresponding to the respective leaf nodes.

The nodes of the hierarchical acceleration structure may be determined by identifying which primitives are present within volumetric elements within the 3-D scene.

In examples described herein the one or more upper levels of nodes are at the top of the hierarchical acceleration structure, and the one or more lower levels of nodes are below (e.g. immediately below) the one or more upper levels in the hierarchical acceleration structure.

The one or more lower levels of nodes may represent multiple sub-hierarchies within the hierarchical acceleration structure, and the root nodes of the sub-hierarchies may be represented as leaf nodes within the one or more upper levels of the hierarchical acceleration structure.

The ray tracing units and processing modules described herein may be embodied in hardware on an integrated circuit. There may be provided a method of manufacturing, at an integrated circuit manufacturing system, a ray tracing unit or a processing module as described herein. There may be provided an integrated circuit definition dataset that, when processed in an integrated circuit manufacturing system, configures the system to manufacture a ray tracing unit or a processing module as described herein. There may be provided a non-transitory computer readable storage medium having stored thereon a computer readable description of an integrated circuit that, when processed, causes a layout processing system to generate a circuit layout description used in an integrated circuit manufacturing system to manufacture a ray tracing unit or a processing module as described herein.

There may be provided an integrated circuit manufacturing system comprising: a non-transitory computer readable storage medium having stored thereon a computer readable integrated circuit description that describes a ray tracing unit or a processing module as described herein; a layout processing system configured to process the integrated circuit description so as to generate a circuit layout description of an integrated circuit embodying the ray tracing unit or the processing module; and an integrated circuit generation system configured to manufacture the ray tracing unit or the processing module according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which:

FIG. 1a shows a scene divided according to a grid subdivision structure;

FIG. 1b represents an acceleration structure for the grid subdivision structure shown in FIG. 1a;

FIG. 2a shows a scene divided according to a binary space partitioning structure;

FIG. 2b represents a hierarchical acceleration structure for the binary space partitioning structure shown in FIG. 2a;

FIG. 3b represents a hierarchical acceleration structure for the quadtree structure shown in FIG. 3a;

FIG. 4b represents a hierarchical acceleration structure for the bounding volume structure shown in FIG. 4a;

FIG. 8a illustrates the path of a ray through a scene which is subdivided according to a spatial subdivision structure;

FIG. 8b represents a hierarchical acceleration structure for the scene shown in FIG. 8a;

FIG. 9a represents the path of a ray through a grid element, wherein the space within the grid element is subdivided according to a bounding volume structure;

FIG. 9b represents a hierarchical acceleration structure for the bounding volume structure shown in FIG. 9a;

Figure 3A:
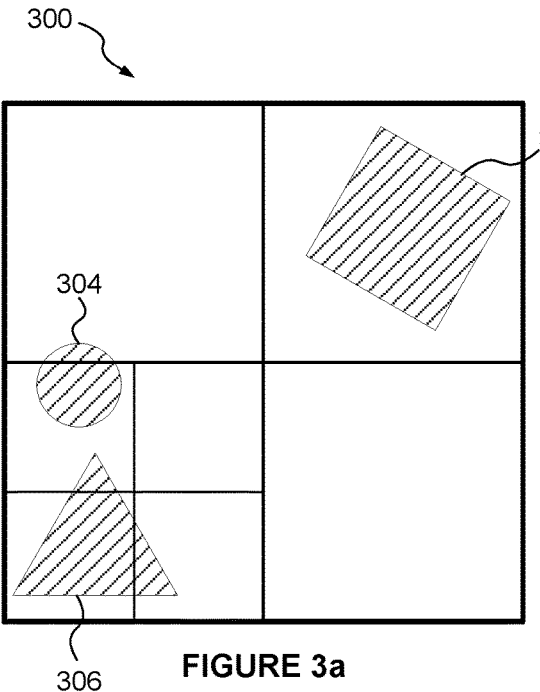
FIG. 3a shows a scene divided according to a quadtree structure.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

Previous ray tracing systems use hierarchical acceleration structures which have a single type of structure throughout. To give some examples, a hierarchical acceleration structure may have one of a grid structure, an octree structure, a space partitioning structure (e.g. a k-d tree), or a bounding volume structure. In contrast, in examples described herein, a hierarchical acceleration structure has different structures at different levels. For example, one or more of the upper levels of the hierarchy have a spatial subdivision structure, whilst one or more lower levels (i.e. below the one or more upper levels in the hierarchy) have a bounding volume structure. The spatial subdivision structure is different to the bounding volume structure. Therefore, the hierarchical acceleration structure has a hybrid structure. In other words, the hierarchical acceleration structure (or "hierarchy") does not have a uniform structure across all of its levels, i.e. different levels of the hierarchy are built such that they have different structures.

There are different techniques for traversing a hierarchical acceleration structure for the purposes of intersection testing in a ray tracing system. For example, some systems implement a depth-first traversal technique in which a subset of the nodes at a particular level of the hierarchy are descended before other nodes at the particular level of the hierarchy are descended. However, other systems implement a breadth-first traversal technique in which all of the nodes at a particular level of the hierarchy are scheduled, at the same time, for processing. Previous ray tracing systems implement a single type of traversal technique when traversing a hierarchical acceleration structure. In contrast, in examples described herein, different traversal techniques are used to traverse different levels of the hierarchical acceleration structure. In particular, there is a transition in traversal behaviour part-way down the hierarchy. In examples described herein, one or more upper levels of the hierarchical acceleration structure are traversed according to a depth-first traversal technique. The depth-first traversal technique involves choosing the most appropriate node (or subset of nodes) to descend first, and initially only descending the chosen node (or subset of nodes). For example, the depth-first traversal technique might mean that only one node is descended at a time. One or more lower levels of the hierarchical acceleration structure are traversed according to a second traversal technique which is different to the traversal technique used to traverse the one or more upper levels of the hierarchy. In examples described herein, the second traversal technique is based on a breadth-first traversal technique. The second traversal technique involves descending all nodes of a level of the hierarchy simultaneously, wherein a scheduling scheme may govern the order in which the nodes are scheduled for processing, e.g. based on the opportunistic availability of needed inputs for processing the nodes, including fetched node data and a critical mass of rays to saturate the testing capability. The second traversal technique is based on a breadth-first traversal technique in the sense that for a given node all children will be processed before any grandchildren. However, the second traversal technique does not enforce a condition that every node of depth N is processed before any nodes of depth N+1 are processed, so it may be considered to be not strictly a breadth-first traversal technique, but it is based on a breadth-first technique.

Depth-first traversal techniques allow the most appropriate nodes of a level (e.g. the nodes closest to a ray origin of a ray to be tested against the nodes) to be descended before other nodes of the level are descended. If the traversal finds a hit (i.e. an intersection) for a ray when descending one of the nodes then it may not need to test the ray against the sub-hierarchies descending from other nodes. This can reduce the number of intersection tests which need to be performed, thereby improving the efficiency of the intersection testing process. In contrast, traversal techniques based on a breadth-first approach can allow greater opportunities for parallelising work to be carried out, e.g. by gathering more rays together into a packet to be tested against the same node. The breadth-first approach can also reduce memory bandwidth (i.e. the amount of data fetched from memory) since more rays can be gathered together for testing against a given node before fetching data for the node. For example, SIMD execution units may be used to execute corresponding intersection tests on a collection of rays in parallel. The efficiency of the intersection testing may be increased by increasing the average number of work items that are included in each SIMD instruction that is processed. A work item identifies a ray and a node which are to be tested for intersection, and the work items may be gathered together into collections to be executed in parallel.

The nodes near the top of the hierarchical acceleration structure represent relatively large volumes in the scene (compared to the volumes represented by the nodes near the bottom of the hierarchical acceleration structure), so the number of rays that intersect with nodes near the top of the hierarchy is greater than the number of rays that intersect with nodes near the bottom of the hierarchy. Therefore, the efficiency gains of the depth-first traversal, achieved by reducing the number of nodes with which rays are tested, are greater near the top of the hierarchy than near the bottom of the hierarchy. Furthermore, in some systems, when using a depth-first traversal technique, the average number of work items that are included in a SIMD instruction is relatively high for nodes near the top of the hierarchy compared to the number of work items that are included in a SIMD instruction for nodes near the bottom of the hierarchy. For example, for nodes near the top of the hierarchy most SIMD instructions may be full, whereas for nodes near the bottom of the hierarchy, many SIMD instructions may be executed even though they are not full. The breadth-first traversal technique provides more opportunities for gathering work items together into packets to be executed in parallel. Therefore, the benefit to the average number of work items that can be executed in parallel that is achieved by using a traversal technique which is based on a breadth-first traversal technique (when compared to using a depth-first traversal technique) is greater for nodes near the bottom of the hierarchy.

For these reasons, examples described herein advantageously use a depth-first traversal technique for traversing nodes near the top of the hierarchical acceleration structure, and use a traversal technique which is based on a breadth-first traversal technique for traversing nodes near the bottom of the hierarchical acceleration structure. There is a trade-off between minimising the number of node tests (using the depth-first traversal technique) and increasing the average number of work items that are executed in parallel (using the breadth-first traversal technique). As such, the level within the hierarchy at which the transition in traversal behaviour is implemented is a design choice and may be different in different examples.

As explained in more detail below, different types of acceleration structure have different properties. For example, FIG. 1a illustrates a scene 100 which comprises three objects 102, 104 and 106. The scene 100 is subdivided into a grid structure, with sixteen grid elements (or "grid cells"), arranged in a 4×4 formation. This is a very simple acceleration structure, and is not hierarchical. For each grid element, a list of indications of objects (or primitives) which are present within the grid element is stored. The generation of these lists is a simple process and may be performed prior to intersection testing. FIG. 1b is illustrative of the contents of the lists which constitute the acceleration structure in this simple example. FIG. 1b identifies the grid elements in which each of the objects are present. When a ray is processed to identify any intersections with geometry in the scene, the intersection tests can be performed for the ray against each of the grid elements. If the ray intersects with a grid element then the ray can be tested against all of the objects/primitives which are present within the grid element to find one or more intersections between the ray and one or more primitives in the scene 100. If more than one intersection is found, then the closest of the "hits" can be identified to thereby identify the first intersection of the ray with a primitive in the scene 100. If the ray does not intersect a grid cell then the ray might not need to be tested against primitives identified as being present within that grid cell (unless those primitives are also present within another grid cell with which the ray does intersect). Therefore, the ray is scheduled for intersection testing against a primitive only if the primitive is present within at least one of the grid cells with which the ray intersects.

The grid structure shown in FIG. 1a is simple to implement but it does have some problems, in particular when primitives are not uniformly distributed in the scene. Where there are large areas of empty space in a scene, processing resources are wasted tracing a ray through empty grid cells. Furthermore, where there is high local complexity, there may be a large number of primitives within a grid cell with which a ray which intersects the grid cell is to be tested. The resolution of the grid could be increased to reduce the number of primitives within a grid cell, but this would exacerbate the empty space problem. A hierarchical acceleration structure allows the resolution of grid cells to be increased in regions which have lots of primitives without increasing the resolution of grid cells in regions which have relatively few primitives. In this sense a hierarchical acceleration structure can be built to adapt to the distribution of primitives in the scene. For example, cells covering empty regions might not be subdivided, whereas cells covering regions including many primitives may be subdivided. One form of hierarchical acceleration structure is a multi-level grid structure.

Another form of hierarchical acceleration structure is a space partitioning structure, such as a k-d tree. A k-d tree is a binary tree in which every node is a k-dimensional point. Every non-leaf node implicitly generates a splitting plane that divides the space into two parts. For example, FIG. 2a shows an example of a two dimensional binary tree (i.e. a k-d tree, where k=2). Each node of the acceleration structure may or may not be divided, depending on the number of primitives which are included in the node. FIG. 2b represents the nodes of the hierarchical acceleration structure representing the regions shown in FIG. 2a. In this example, the scene 200 includes three objects (202, 204 and 206). The binary space partitioning structure shown in FIG. 2a has a top level node 210 which covers the whole scene 200. In this 2D example, nodes which contain more than one object are split in half along either the x or the y direction (in alternating directions). In 3-D examples, the splitting planes may cycle through the x, y and z axes in sequence. Since the node 200 includes more than one object, it is split into two nodes (left and right nodes) $212_1$ and $212_2$. The right node $212_2$ covers just one object (202) so the node $212_2$ is not further subdivided. The node $212_2$ is a leaf node and includes a reference to the object 202. The left node 212₁ covers two objects (204 and 206) and is split into two nodes (top and bottom nodes) 214₁ and 214₂. The top node 214₁ covers just one object (204) so the node 214₁ is not further subdivided (where the term "cover" is used here to mean "at least partially cover"). The node 214₁ is a leaf node and includes a reference to the object 204. The bottom node 214₂ covers two objects (204 and 206) and is split into two nodes (left and right nodes) 216₁ and 216₂. The right node 216₂ covers only the object 206 so it is a leaf node which includes a reference to the object 206. The left node 216₁ covers both objects 204 and 206. Although the node 216₁ covers more than object, in this example the node is not further subdivided because a limit on the number of levels in the hierarchy is imposed. The node 216₁ therefore includes references to both the objects 204 and 206.

Figure 3B:
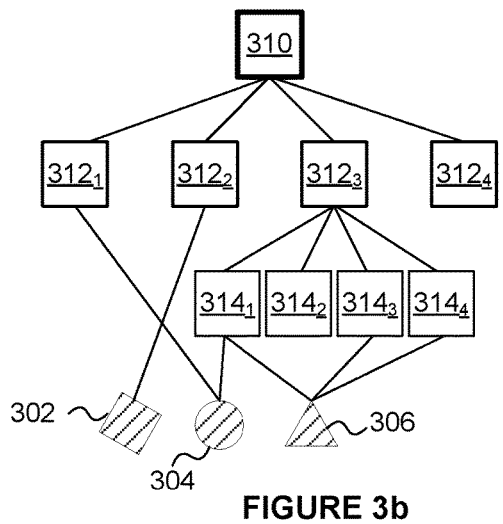

Another example of a spatial subdivision structure is an octree structure, in which 3-D space is recursively subdivided by halving a node in each of three spatial directions (e.g. along x, y and z axes) thereby subdividing a node into eight equal regions, which are represented as child nodes in the hierarchy. FIG. 3a represents a corresponding two dimensional example (i.e. a quadtree) in which a node is halved in both x and y directions, depending on the complexity of the content (e.g. the number of primitives) within the nodes. FIG. 3a illustrates a scene 300 which includes three objects 302, 304 and 306. FIG. 3b represents the nodes of the hierarchical acceleration structure representing the regions shown in FIG. 3a. The acceleration structure shown in FIGS. 3a and 3b has a top level node 310 which covers the whole scene 300. The node 310 is subdivided into four quads, represented by the nodes 312₁ to 312₄. The node 312₁ represents the top left quad of the node 310 and is not further subdivided. The node 312₁ includes a reference to the object 304. The node 312₂ represents the top right quad of the node 310 and is not further subdivided. The node 312₂ includes a reference to the object 302. The node 312₄ represents the bottom right quad of the node 310 and is empty and not further subdivided. The node 312₃ represents the bottom left quad of the node 310 which covers both of the objects 304 and 306. Node 312₃ is subdivided into four quads 314₁ to 314₄. The node 314₁ represents the top left quad of the node 312₃ and is not further subdivided. The node 314₁ includes references to the objects 304 and 306. The node 314₂ represents the top right quad of the node 312₃ and is empty and not further subdivided. The node 314₃ represents the bottom left quad of the node 312₃ and is not further subdivided. The node 314₃ includes a reference to the object 306. The node 314₄ represents the bottom right quad of the node 312₃ and is not further subdivided. The node 314₄ includes a reference to the object 306.

The empty nodes (e.g. 312₄ and 314₂) can either be excluded entirely from the hierarchy or they can be included in the hierarchy but marked as "empty" so that no intersection testing is performed on the empty nodes. The encoding format determines which of these two options is more suitable. In both cases, conceptually, the empty nodes can be considered to be excluded because the traversal of the hierarchy during intersection testing will not include testing of the empty nodes.

Figure 4A:
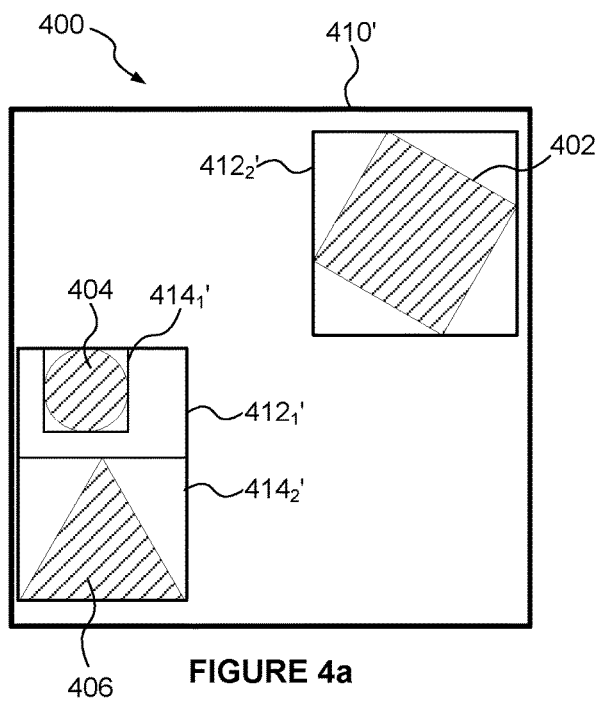
FIG. 4a shows a scene divided according to a bounding volume structure.
Figure 4B:
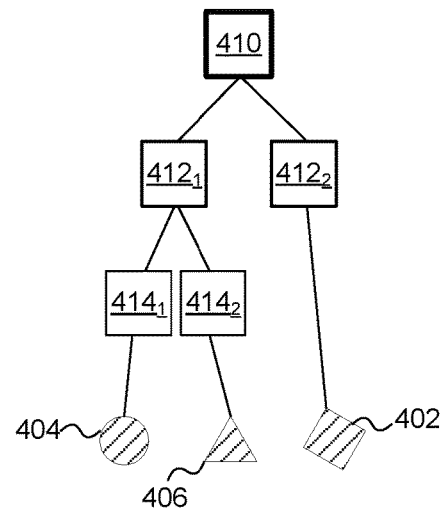

FIGS. 1a to 3b described above relate to examples of spatial subdivision structures for dividing the space of a scene into regions and forming nodes of a hierarchical acceleration structure to represent those regions of the scene. In contrast, FIGS. 4a and 4b relate to a hierarchy having a bounding volume structure. FIG. 4a illustrates a scene 400 which includes three objects 402, 404 and 406. FIG. 4b shows nodes of a hierarchical acceleration structure wherein the root node 410 represents the whole scene 400. Regions in the scene shown in FIG. 4a have references matching those of the corresponding nodes in the hierarchy shown in FIG. 4b, but the references for the regions in FIG. 4a include an additional prime symbol ('). The objects in the scene are analysed in order to build the hierarchy, and two nodes 412₁ and 412₂ are defined within the node 410 which bound regions containing objects. In this example, the nodes in the bounding volume hierarchy represent axis-aligned bounding boxes (AABBs) but in other examples the nodes could represent regions which take other forms, e.g. spheres or other simple shapes. The node 412₁ represents a box 412₁' which covers the objects 404 and 406. The node 412₂ represents a box 412₂' which covers the object 402. The node 412₁ is subdivided into two nodes 414₁ and 414₂ which represent AABBs (414₁' and 414₂') which respectively bound the objects 404 and 406. Methods for determining the AABBs for building nodes of a hierarchy are known in the art, and may be performed in a top-down manner (e.g. starting at the root node and working down the hierarchy), or may be performed in a bottom-up manner (e.g. starting at the leaf nodes and working up the hierarchy). In the example shown in FIGS. 4a and 4b, objects do not span more than one leaf node.

When traversing a hierarchical acceleration structure for intersection testing of a ray in a scene, the ray is initially tested against the root node. If an intersection is found between the ray and a node then the ray may be scheduled for intersection testing with one or more nodes which are children of the intersected node. In a depth-first traversal technique a subset of the children of an intersected node (e.g. a single child of the intersected node) may be scheduled and processed for intersection testing before optionally scheduling other children of the intersected node for intersection testing, depending on the results of the previous intersection testing. However, according to a breadth-first traversal technique, if an intersection is found between a ray and a node then the ray may be scheduled for intersection testing with all of the nodes which are children of the intersected node prior to performing the intersection testing for any of those children.

Figure 5:
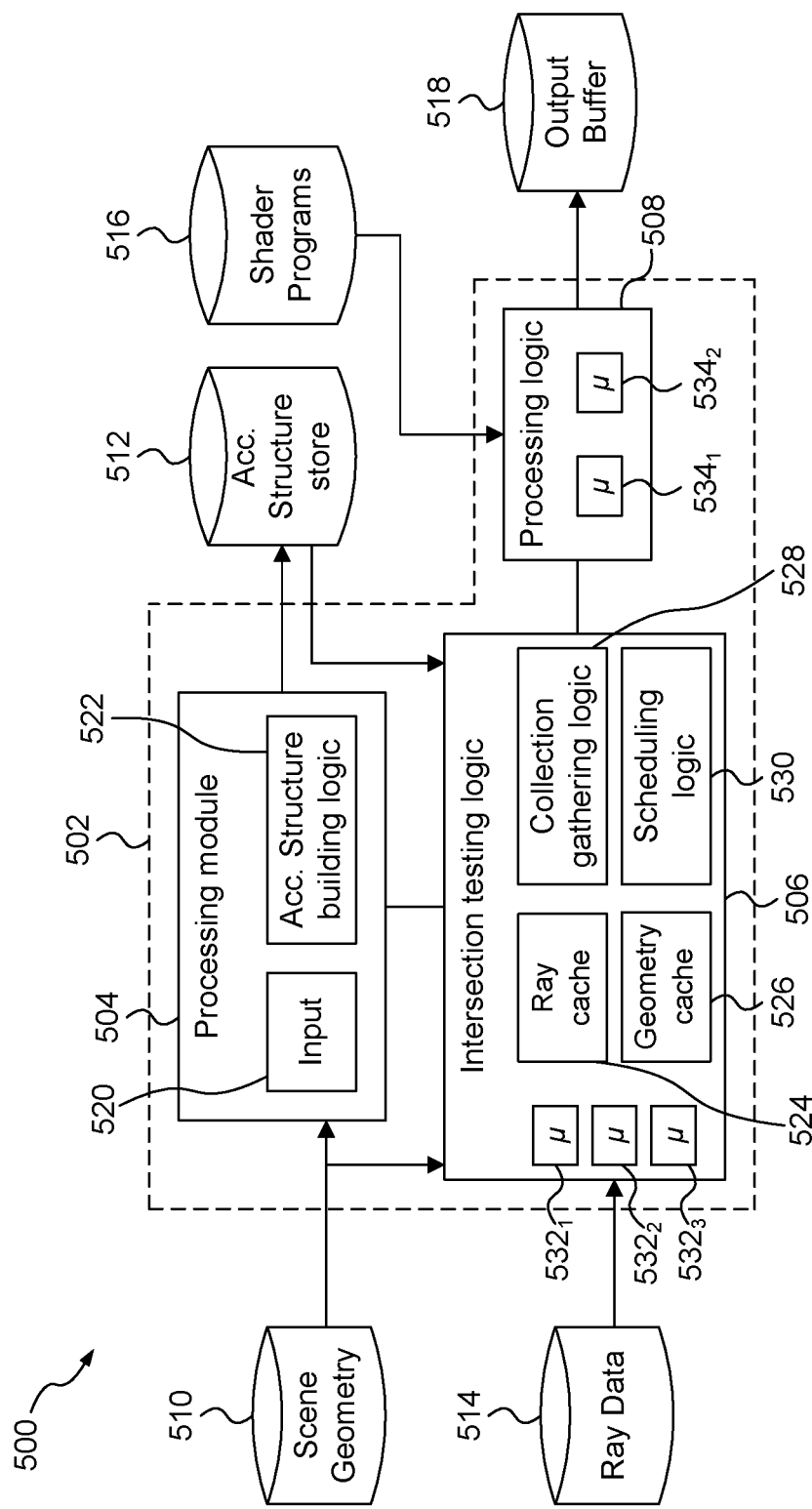
FIG. 5 illustrates a ray tracing system.

FIG. 5 illustrates a ray tracing system 500 which is configured to render an image of a 3-D scene. The ray tracing system 500 comprises a ray tracing unit 502 which is configured to perform intersection testing and to execute shader programs in response to identifying intersections. The ray tracing unit 502 comprises a processing module 504 which is configured to generate a hierarchical acceleration structure to be used for intersection testing in the ray tracing system 500. The ray tracing unit 502 also comprises intersection testing logic 506 and processing logic 508. The ray tracing system 500 also comprises a number of different stores (510 to 518) which are coupled to the ray tracing unit 502. FIG. 5 shows the stores (510 to 518) being implemented outside of the ray tracing unit 502 and coupled thereto, but in some examples one or more of the stores (510 to 518) may be implemented as part of the ray tracing unit 502. In particular, the ray tracing system 500 comprises a scene geometry data store 510, an acceleration structure store 512, a ray data store 514, a shader program store 516 and an output buffer 518.

The scene geometry data store 510 is configured to store data defining the geometry in the scene to be rendered. The ray tracing unit 502 is coupled to the scene geometry data store 510 and configured to receive the data defining the geometry in the scene (e.g. in the form of primitives describing objects in the scene). The geometry data is provided to the processing module 504 and to the intersection testing logic 506. The processing module 504 comprises an input 520 and acceleration structure building logic 522, and is configured to use the geometry data to generate a hierarchical acceleration structure describing the geometry within the scene. The generation of the hierarchical acceleration structure is described below with reference to FIG. 6. The hierarchical acceleration structure provided by the processing module 504 is passed to, and stored in, the acceleration structure store 512.

The intersection testing logic 506 is configured to access the hierarchical acceleration structure stored in the store 512. The intersection testing logic 506 is further arranged to receive the scene geometry data and to receive ray data defining rays to be traversed through the acceleration structure. The intersection testing logic 506 comprises a ray cache 524 for storing ray data, a geometry cache 526 for storing geometry data, collection gathering logic 528, scheduling logic 530 and one or more execution units $532_1$ to $532_3$. The intersection testing logic 506 is configured to perform intersection testing by traversing the hierarchical acceleration structure as described below with reference to FIG. 7.

Results of the intersection testing are passed to the processing logic 508. The processing logic 508 comprises one or more execution units $534_1$ to $534_2$, and is configured to use results of the traversal of the hierarchical acceleration structure for rendering an image of the 3-D scene. In particular, the processing logic 508 can execute shader programs (e.g. which have been received from the shader program store 516) in response to an indication of an intersection between a ray and a primitive in the scene. The execution of a shader program at the processing logic 508 may result in the emission of one or more rays (which may be referred to as "secondary rays") which can be passed back to the intersection testing logic 506 for intersection testing. The execution of a shader program at the processing logic 508 may also determine an image value (e.g. a pixel value) which can be stored in the output buffer 518. The output buffer 518 (which may be referred to as a frame buffer) may store pixel values of an image being rendered by the ray tracing system 500.

Figure 6:
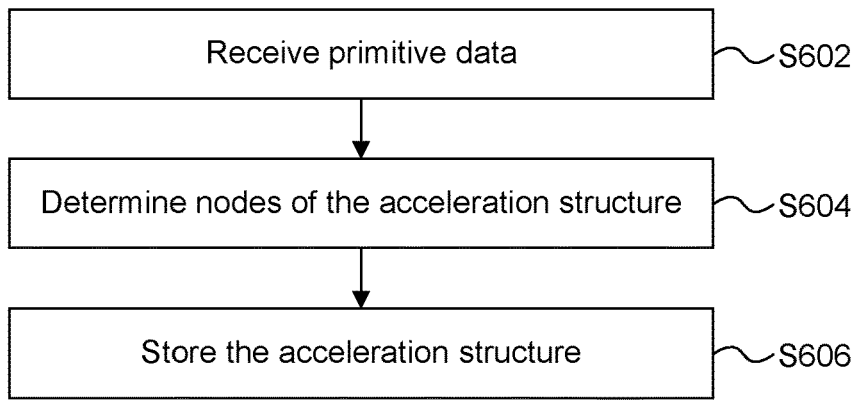
FIG. 6 is a flow chart for a method of generating a hierarchical acceleration structure.

FIG. 6 is a flow chart for a method of generating the hierarchical acceleration structure to be used for intersection testing in the ray tracing system 500. In step S602 primitive data for primitives located in a 3-D scene to be rendered is received at the input 520 of the processing module 504. In the example shown in FIG. 5 the primitive data (or "geometry data") is received from the scene geometry data store 510.

In step S604 the acceleration structure building logic 522 determines the nodes of the hierarchical acceleration structure for the scene. The nodes of the hierarchical acceleration structure represent volumetric elements within the 3-D scene. Methods for analysing the primitives within a scene to determine nodes of an acceleration structure according to a bounding volume structure are described in U.S. Pat. No. 8,717,357. For example, the acceleration structure building logic 522 may identify which primitives are present within volumetric elements within the 3-D scene. The logic 522 may determine primitive indications for leaf nodes of the hierarchical acceleration structure to indicate primitives which are present within the volumetric elements corresponding to the respective leaf nodes. However, as described above, in examples described herein the hierarchical acceleration structure that is built to describe the geometry in the scene does not have a single type of structure. In particular, one or more upper levels of nodes of the hierarchical acceleration structure have a different type of structure to the type of structure used for one or more lower levels of nodes of the hierarchical acceleration structure. Therefore, the hierarchical acceleration structure has a hybrid structure. For example, the one or more upper levels of the acceleration structure may be defined according to a spatial subdivision structure (e.g. a grid structure, a multi-level grid structure, an octree structure or a space partitioning structure such as a k-d tree); whereas the one or more lower levels of the acceleration structure may be defined according to a bounding volume structure.

Figure 10:
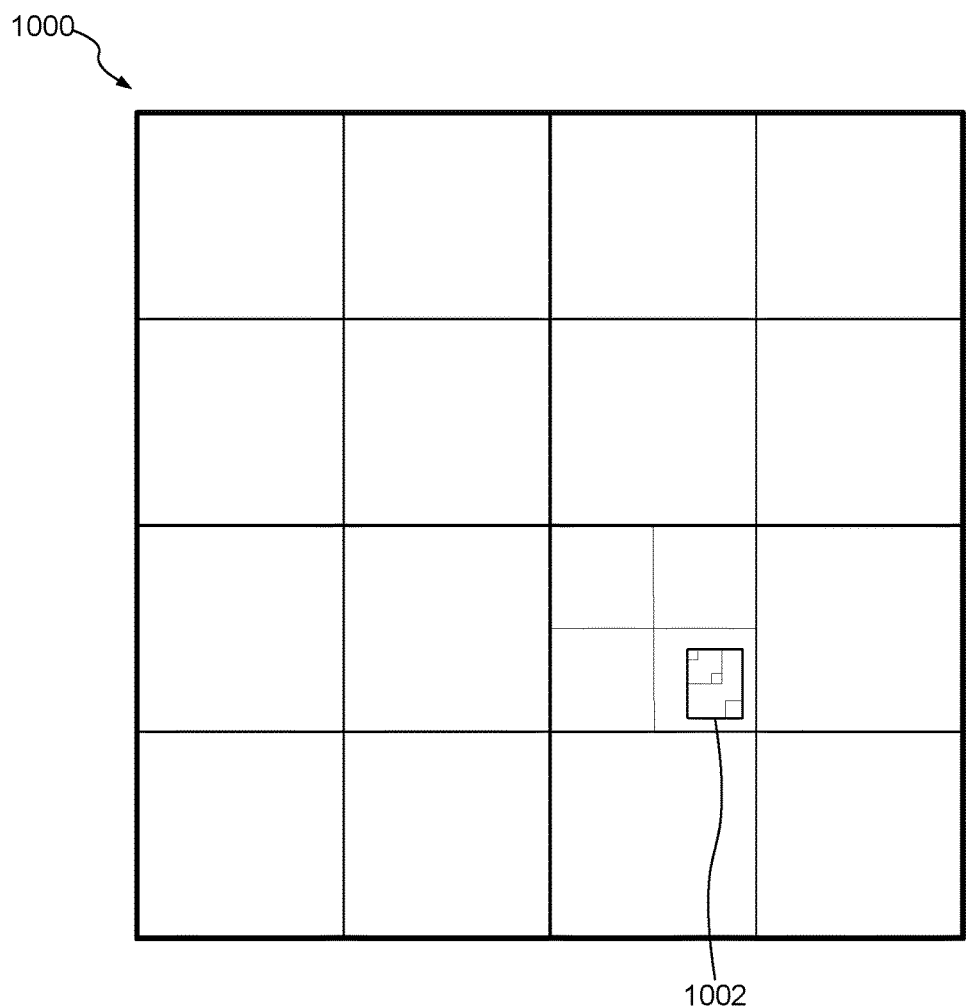
FIG. 10 illustrates the spatial position of a node of a bounding volume hierarchy within a scene with reference to an octree subdivision structure.

The transition between the different types of structure within the hierarchical acceleration structure may be handled differently in different examples. FIG. 10 shows a simple example in which a scene 1000 is subdivided using an octree structure for the upper four levels of the hierarchy. For clarity, FIG. 10 is a 2D depiction of some of the regions corresponding to nodes of the hierarchical acceleration structure. The highest level node (i.e. the "root node") of the hierarchy represents an AABB covering the whole visible scene. The root node has eight child nodes representing the octants within the root node region. Each of those child nodes is subdivided into eight further child nodes, and then each of those further child nodes is subdivided into eight final child nodes of the octree structure. The 2D representation of FIG. 10 shows the root node being subdivided into four quadrants, each of which is subdivided into four quadrants, wherein one of those quadrants is shown as being further subdivided into four quadrants, wherein all of the quadrants are determined according to a subdivision of the space of the scene to be rendered. Within one of those quadrants is a bounding box 1002 which is defined according to a bounding volume structure. The bounding box 1002 is subdivided into further bounding volume nodes.

In this example, the nodes at the lower levels of the acceleration structure are assembled from a numerically-aligned octree scaffolding. For example, the AABB 1002 is defined by referencing a node of the octree structure and then specifying the minimum and maximum coordinates (in x and y directions) of the box 1002 within the referenced node of the octree structure. The maximum size of the sub-hierarchy which starts with the box 1002 can be inferred by simply identifying the node of the octree structure which is referenced.

In other examples, the nodes of the lower levels which are defined according to the bounding volume structure might not be aligned with the octree structure of the upper levels. In these examples, the acceleration structure may be built in a top-down manner, e.g. the building of the acceleration structure may entail conservatively voxelising primitives into grid voxels (i.e. according to the spatial subdivision structure) and then constructing leaf hierarchies (according to the bounding volume structure). Alternatively, the acceleration structure may be built in a bottom-up manner. A balancing algorithm may be used where the upper nodes are defined organically during construction of the acceleration structure, e.g. when a threshold of enclosed primitives or surface area is exceeded then an upper-level node may be divided into multiple child nodes in the upper-level hierarchy.

In some examples the whole hierarchy could be built from the bottom up according to the bounding volume structure and then the resulting hierarchy could be analysed and the nodes of the upper levels could be replaced with nodes defined according to a spatial subdivision structure. In other examples, the hierarchy could be built from the bottom upwards according to the bounding volume structure, until a point (e.g. a particular octree size), and then the upper levels (above this point) may be built according to the spatial subdivision structure.

When the acceleration structure has been built, in step S606 the hierarchical acceleration structure is stored in the acceleration structure store 512 for use in intersection testing. In particular, the processing module 504 sends the acceleration structure to the store 512 for storage therein. As mentioned previously, although the acceleration structure store 512 is shown in FIG. 5 as being outside of the ray tracing unit 502 (e.g. the store 512 may be implemented in system memory and coupled to the ray tracing unit 502 via a system bus), in some examples the acceleration structure store 512 may be implemented on chip, e.g. as part of the ray tracing unit 502.

Figure 7:
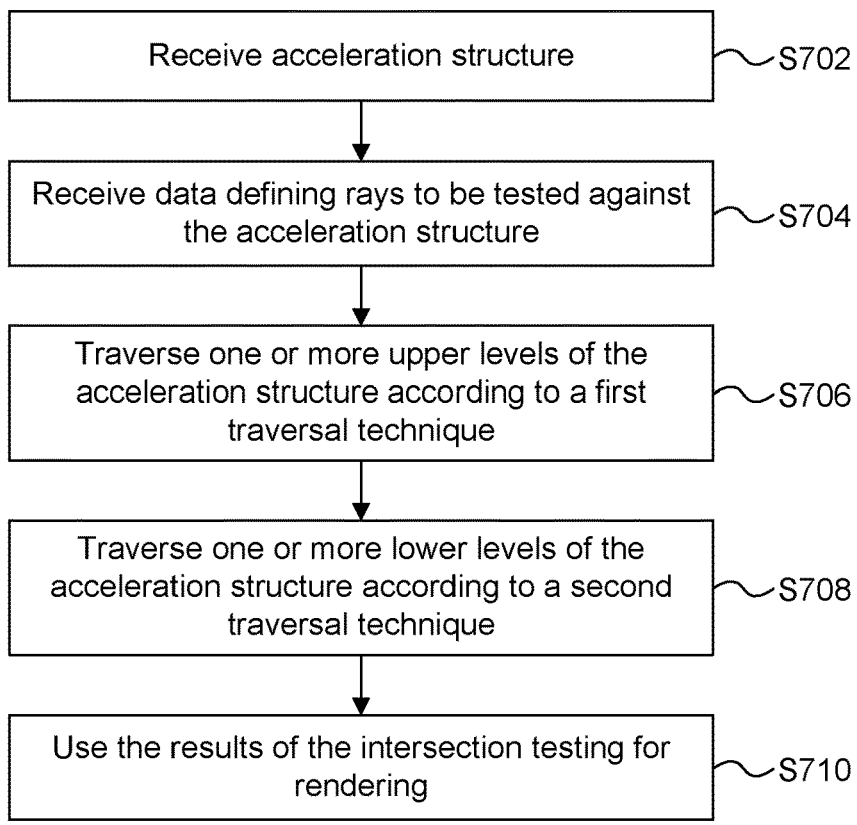
FIG. 7 is a flow chart for a method of performing intersection testing in a ray tracing system.

FIG. 7 is a flow chart for a method of performing intersection testing in the ray tracing system 500. In step S702 the intersection testing logic 506 receives the hierarchical acceleration structure representing the geometry in the scene from the acceleration structure store 512. The intersection testing logic 506 may also receive the geometry data (e.g. primitive data) from the scene geometry data store 510. In step S704 the intersection testing logic 506 receives data defining rays to be tested against the acceleration structure. The ray data may be received from the ray data store 514. The ray data can be stored in the ray cache 524 so that it can be used more than once without needing to fetch the data from the store 514 each time it is used.

The intersection testing logic 506 performs intersection testing on rays against the geometry in the scene by traversing the hierarchical acceleration structure. Methods are known in the art for testing whether a ray intersects with a volume (e.g. an axis-aligned bounding box) represented by a node in the hierarchy. In particular, in step S706 the intersection testing logic 506 traverses one or more upper levels of nodes of the hierarchical acceleration structure according to a first traversal technique. In examples described herein, the one or more upper levels of nodes of the hierarchical acceleration structure which are traversed according to the first traversal technique are the nodes which are defined according to the spatial subdivision structure (e.g. an octree structure). The first traversal technique is based on a depth-first traversal technique. In this way, where there are multiple nodes at a level within the acceleration structure, the intersection testing logic chooses the most appropriate node (or subset of nodes) to descend first, and only descends the chosen node (or subset of nodes) at a time.

In step S708 the intersection testing logic 506 traverses one or more lower levels of nodes of the hierarchical acceleration structure according to a second traversal technique. In examples described herein, the one or more lower levels of nodes of the hierarchical acceleration structure which are traversed according to the second traversal technique are the nodes which are defined according to the bounding volume structure. When a ray is found to intersect with a leaf node of the hierarchical acceleration structure then the ray is tested against the primitives which are indicated as being present within the volume represented by the leaf node. The geometry data representing primitives to be tested may be stored in the geometry cache 526. In examples described herein, the second traversal technique is not based on a depth-first traversal technique. In particular, the second traversal technique may be based on a breadth-first traversal technique in the sense that for a given node all children will be processed before any grandchildren are processed. The scheduling logic 530 may schedule the intersection testing of nodes with rays based on the availability of node data and ray data. In some examples, the second traversal technique may descend all nodes at a level of the hierarchy simultaneously, with the scheduling of the intersection testing being governed by the availability of inputs (e.g. fetched node data) and a sufficient number of rays to make efficient use of the testing capability, i.e. to attempt to increase the number of work items that are included in SIMD tasks which are executed by the execution units 532. As an example, there may be a threshold number of work items in a SIMD task that must be met before the task is executed.

The collection gathering logic 528 gathers intersection testing work items together into collections to be executed in parallel by the execution units 532. As described above, an intersection testing work item identifies a ray and a node which are to be tested for intersection. In examples described herein, the scheduling logic 530 schedules collections of work items for execution by the execution units 532 based on the numbers of work items in the collections.

The results of intersection testing performed by the intersection testing logic 506 indicate, for each ray tested, whether an intersection has been found in the scene (i.e. a "hit" or a "miss"), and if a hit has been found then the results may indicate which primitive has been intersected (e.g. usually the closest of the intersected primitives where the ray has intersected more than one primitive). The results may also indicate a position of the intersection within the intersected primitive (e.g. using barycentric coordinates). Results of the intersection testing can be passed to the processing logic 508. In step S710, the processing logic 508 uses the intersection testing results, e.g. for rendering an image of the 3-D scene. For example, the processing logic 508 can execute shader programs on the execution units 534. The shader programs may be retrieved from the shader program store 516. The results of executing the shader programs at the processing logic 508 may be rendered pixel values of the image being rendered, and in this case the rendered pixel values can be provided to the output buffer 518 for storage therein. As described above, the execution of a shader program may emit one or more rays (secondary rays) into the scene which are passed back to the intersection testing logic 506 for intersection testing.

FIGS. 8a to 9b illustrate an example of intersection testing which can be performed for a ray passing through a scene. This example is two dimensional for ease of illustration; a skilled person would, having read this description, understand how the principles described in relation to this 2D example could be applied to 3-D examples. Also, this example is very simple in terms of the number of primitives (or objects) which are present in the scene, and in real systems, it is likely that there will be many more objects in the scene than is shown in FIG. 9a. FIG. 8a shows a scene 800 through which a ray 802 passes. FIG. 8b illustrates the upper levels of a hierarchical acceleration structure which is created for the scene 800. A root node 810 corresponds to an AABB 810' covering the entire scene 800. The space within the box 810' is subdivided into top and bottom halves ($812_1'$ and $812_2'$), and the corresponding nodes $812_1$ and $812_2$ make up the second level within the hierarchy shown in FIG. 8b. The box $812_1$ is subdivided into four quadrants ($814_1'$ to $814_4'$), and the box $812_2'$ is subdivided into four quadrants ($814_5'$ to $814_8'$). The third level of the hierarchy has eight nodes $814_1$ to $814_8$ corresponding to the eight boxes $814_1'$ to $814_8'$. In this example, the upper three levels of the hierarchical acceleration structure are defined in terms of a spatial subdivision scheme. However, the levels below the third level within the hierarchical acceleration structure are defined according to a bounding volume scheme.

FIG. 9a shows more detail within the box $814_7'$. The box $814_7'$ is the first of the boxes corresponding to the third-level nodes that the ray 802 intersects. In the example shown in FIG. 9a the scene includes seven objects (902, 904, 906, 908, 910, 912 and 914) within the box $814_7'$. In the hierarchical acceleration structure, the node $814_7$ has two child nodes: $916_1$ and $916_2$. As can be seen in FIG. 9a, the box $916_1'$ is an AABB which bounds the six objects 904, 906, 908, 910, 912 and 914; and the box $916_2'$ is an AABB which bounds object 902. The box $916_2'$ is an AABB which bounds object 902. The node $916_2$ does not have any children in the acceleration structure, such that node $916_2$ is a leaf node which includes a reference to the object 902. The node $916_1$ has three child nodes in the acceleration structure: $918_1$, $918_2$ and $918_3$. As can be seen in FIG. 9a, the box $918_1'$ is an AABB which bounds the four objects 904, 906, 908, 910. The node $918_1$ does not have any children in the acceleration structure, such that node $918_1$ is a leaf node which includes a reference to the objects 904, 906, 908 and 910. The box $918_2'$ is an AABB which bounds object 912. The node $918_2$ does not have any children in the acceleration structure, such that node $918_2$ is a leaf node which includes a reference to the object 912. The box $918_3'$ is an AABB which bounds object 914. The node $918_3$ does not have any children in the acceleration structure, such that node $918_3$ is a leaf node which includes a reference to the object 914.

Figure 11:
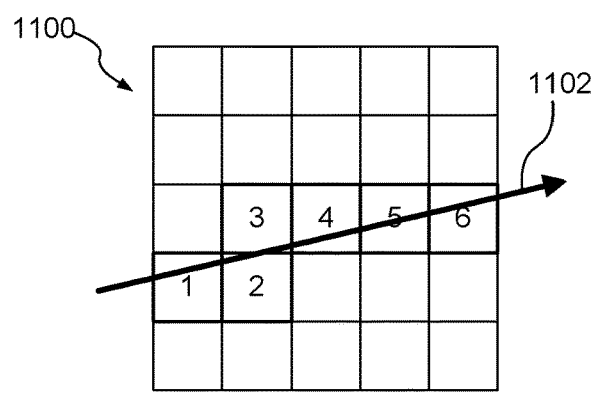
FIG. 11 illustrates the path of a ray through a scene which is subdivided into grid elements.

The intersection testing logic 506 traverses the hierarchical acceleration structure shown in FIGS. 8b and 9b to perform the intersection testing of the ray 802 against the scene 800. The top three levels of the hierarchy are traversed in a depth-first manner. The traversal according to a depth-first technique uses a metric to determine an order in which to descend nodes of the hierarchical acceleration structure. The metric is chosen so that more appropriate nodes are descended before less appropriate nodes. For example, the metric may comprise a distance metric component, wherein the distance metric component is arranged to cause closer nodes (i.e. closer to the ray origin) to be descended before more distant nodes. The intersection testing logic 506 may use a Digital Differential Analyzer (DDA) technique to determine the ordering in which the nodes of the one or more upper levels are descended according to the distance metric component. A DDA algorithm for the DDA technique first computes the starting cell of a ray in the data structure. The structure needs to be spatially split (like a grid or octree) so that cells are packed against each other (i.e. the cells are contiguously packed). The DDA algorithm then determines the cells which the ray travels though, in the order they are intersected. The algorithm uses the slope (i.e. the gradient) of the ray to compute which face of the current cell the ray exits first, and that axis is the one that the ray should "step" into next. This is equivalent to three (in the 3-D case) ray-plane intersections and we find the smallest intersection distance. In other words, the algorithm finds which face of a cell the ray exits and then steps into the cell adjoining that face. The current cell is then updated and processed however required, e.g. by traversing a bounding volume sub-hierarchy descending from the current cell. The distance to the next edge can easily be updated using the slope of the ray and grid cell size, so that subsequent iterations need not re-compute them. The process can be repeated to walk the ray through the structure (e.g. as shown in FIG. 11, which is described below).

In the example shown in FIG. 8a, the origin of the ray 802 is below and to the left of the scene 800. Therefore, the node $812_2$ (which corresponds to the lower region $812_2'$) is tested and descended before the node $812_1$ (which corresponds to the upper region $812_1'$) is descended. If the intersection testing finds a hit within the nodes descending from node $812_2$ then intersection testing might not be performed on node $812_1$ or on the nodes descending from node $812_1$.

According to the distance metric component, the nodes within the node $812_1$ are tested in the order $814_7$, $814_5$, $814_8$, $814_6$. So the sub-hierarchy below the node $814_7$ is the first of the bounding volume sub-hierarchies to be tested for intersection. The nodes of this sub-hierarchy (shown in FIG. 9b) are tested according to the second traversal technique (i.e. based on a breadth-first technique). For example, the nodes $916_1$ and $916_2$ can be scheduled for intersection testing at the same time. The actual execution of the intersection tests depends on how the intersection work items are gathered together into collections to be executed in parallel. For example, different rays to be tested against the same node can be grouped together for parallel intersection testing. Furthermore, in some examples, different nodes to be tested against the same ray can be grouped together for parallel intersection testing. The grouping of the intersection testing work items into collections for intersection testing is implementation dependent, and the details of this grouping process is beyond the scope of the current disclosure. It can be seen in FIG. 9a that the ray 802 hits the box $916_1$, so the ray 802 is scheduled for intersection testing against the nodes $918_1$, $918_2$ and $918_3$.

The results of the intersections tests will show that ray 802 misses the boxes $916_2$, $918_1$, $918_2$ and $918_3$. Therefore, the ray 802 is not tested against any of the objects (902 to 914).

Since the ray does not intersect any geometry within the box $814_7$, the intersection testing then descends the next sub-hierarchy according to the distance metric, i.e. the sub-hierarchy descending from node $814_5$ because this is the next node that the ray 802 intersects.

The intersection testing proceeds until an intersection is identified for the ray 802. If no intersection is found within box $814_5$ then the ray 802 is tested against node $814_8$, but it will be found that the ray 802 misses the box $814_8$ so the node $814_8$ is not descended, and instead the ray 802 would be tested against node $814_6$ (which is a hit), and then the sub-hierarchy descending from node $814_6$ would be traversed.

If no intersections have been found for the ray 802 within the nodes descending from node $812_2$ in the hierarchy, then the nodes descending from node $812_1$ are tested. The nodes $814_1$ to $814_4$ will be tested in the order: $814_3$ (miss), $814_1$ (miss), $814_4$ (hit), $814_2$ (hit) according to the distance metric used by the depth-first traversal technique of this example.

The lower levels of nodes (e.g. the nodes defined according to the bounding volume structure) represent multiple sub-hierarchies within the hierarchical acceleration structure, wherein the root nodes of the sub-hierarchies are represented as leaf nodes within the one or more upper levels of the hierarchical acceleration structure. For example, the node $814_7$ is a leaf node within the upper three levels (i.e. it is in the lowest level (the third level) of the upper levels), and this node $814_7$ is a root node for the sub-hierarchy shown in FIG. 9b. The depth-first traversal of the one or more upper levels of nodes of the hierarchical acceleration structure in step S706 (i.e. the traversal of nodes 810 to 814) determines an order in which the sub-hierarchies are selected for traversal in step S708.

To put it another way, there can be considered to be a hierarchy of sub-hierarchies (or "leaf-hierarchies"), wherein the levels of the hierarchy above the leaf hierarchies have a differently formatted structure to the leaf hierarchies (i.e. the bounding volume trees) themselves. Rays traverse the "leaf hierarchies" in an order that means leaf hierarchies which include more appropriate nodes (e.g. closer nodes) are traversed before traversing other leaf hierarchies. Furthermore, it can be beneficial to limit the simultaneous traversal operations for a given ray to a subset of the intersected leaf trees, effectively deferring traversal in more distant subtrees. In this way, the intersection testing logic 506 traverses the one or more lower levels of nodes of the hierarchical acceleration structure according to the second traversal technique by grouping intersection testing work items for nodes within a subset of one or more of the sub-hierarchies together into collections to be executed in parallel. The size of the subset can be one, giving a perfectly ordered "march" through subtrees. In examples in which the subsets each comprise a single sub-hierarchy, the intersection testing logic 506 traverses the hierarchical acceleration structure by sequentially selecting the sub-hierarchies to be traversed, wherein the order in which the sub-hierarchies are selected is determined by the depth-first traversal of the one or more upper levels of nodes of the hierarchical acceleration structure. During the traversal of the acceleration structure the intersection testing logic 506 performs a march of rays through the upper levels of the acceleration structure and at each visited volumetric element the ray is enqueued for traversal against the subtree indexing the primitives which overlap that volume.

FIG. 11 illustrates a scene 1100 which is subdivided into a number of grid cells. A ray 1102 passes through the scene 1100 and intersects with the cells labelled 1 to 6, in the indicated sequence. The ordering of this sequence can be determined using a DDA technique as described above. Each of the cells may correspond to a root node of a sub-hierarchy (or "leaf hierarchy") to be descended. In an example in which single sub-hierarchies are descended at a time, the sub-hierarchy of which cell 1 is the root node is traversed first. Then if no intersections are found, the sub-hierarchy of which cell 2 is the root node is traversed; then if no intersections are found, the sub-hierarchy of which cell 3 is the root node is traversed, and so on until an intersection hit is found.

However, in some examples the subset of sub-hierarchies which are traversed together comprises a plurality of sub-hierarchies (e.g. two sub-hierarchies). For example, with reference to FIG. 11, the sub-hierarchies of which cells 1 and 2 are the root nodes are traversed first together. Then if no intersections are found, the sub-hierarchies of which cells 3 and 4 are the root nodes are traversed, and so on until an intersection hit is found. In these examples, groups of sub-hierarchies are traversed at a time, e.g. a first group corresponding to cells 1 and 2 is traversed, and then a second group corresponding to cells 3 and 4 is traversed, and so on. The intersection testing logic 506 traverses the lower levels of nodes of the hierarchical acceleration structure by traversing a sequence of groups of sub-hierarchies.

Figure 12:
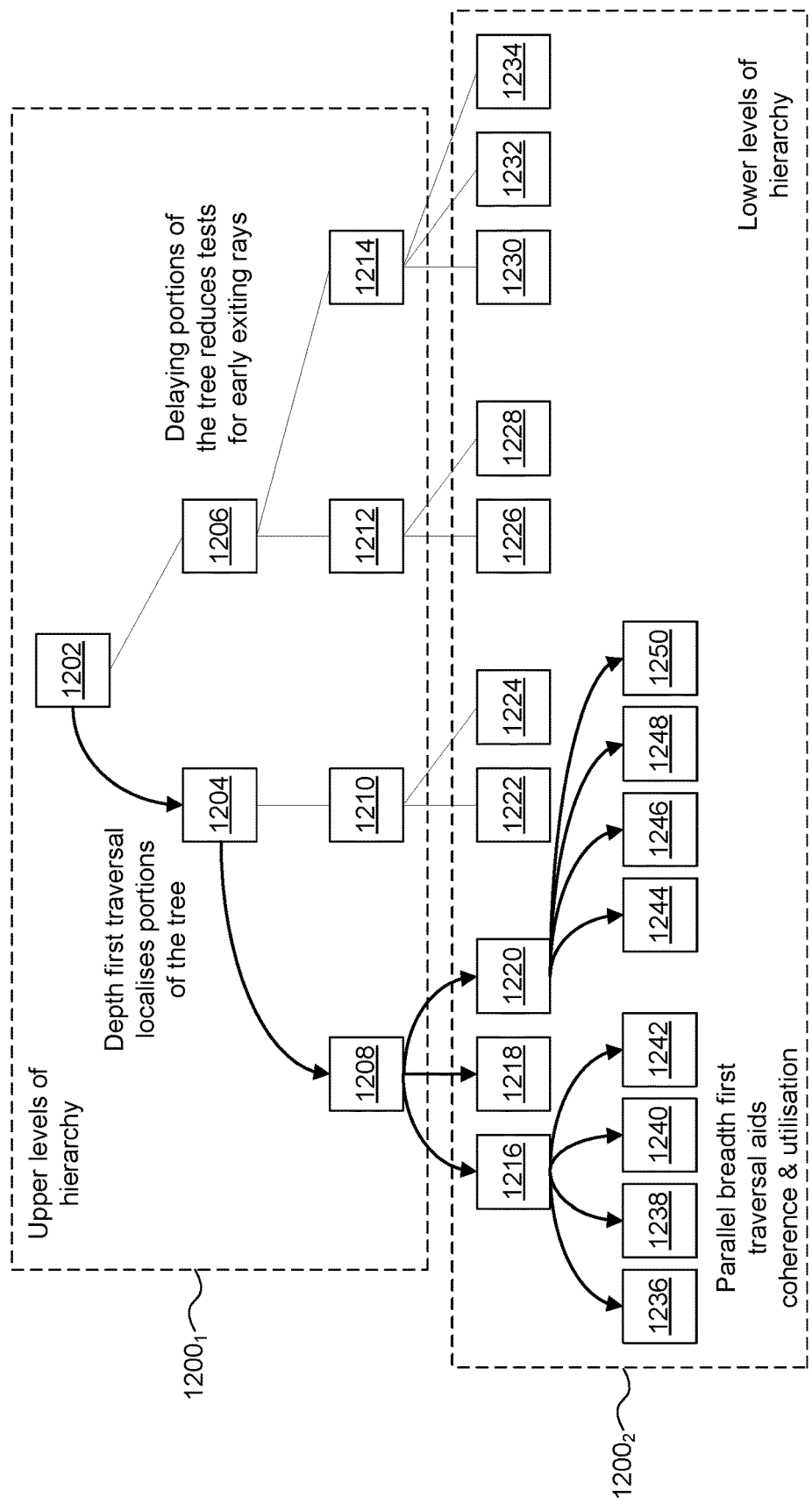
FIG. 12 illustrates traversal of a hierarchical acceleration structure.

FIG. 12 illustrates traversal of a hierarchical acceleration structure according to examples described herein. The hierarchical acceleration structure shown in FIG. 12 has three upper levels of nodes $1200_1$ (including nodes 1202 to 1214) and two lower levels of nodes $1200_2$ (including nodes 1216 to 1250). The traversal of the nodes is illustrated with the arrows in FIG. 12. The traversal starts with the root node 1202. The traversal of the upper levels $1200_1$ is a depth first traversal which localises portions of the hierarchy (or "tree"). Node 1204 is descended before node 1206. Node 1208 is descended before node 1210. The traversal of the lower levels $1200_2$ is a parallel breadth first traversal, which increases the opportunities for gathering rays together for parallel testing, thereby increasing the coherence of the parallel processing. This increases the utilisation of the parallel processing execution units (e.g. increases the average number of SIMD work items that are executed in parallel), thereby improving the efficiency of the intersection testing. Descending from node 1208, the nodes 1216, 1218 and 1220 can be scheduled for execution. Furthermore, if node 1216 is found to be a hit for a ray then nodes 1236 to 1242 which descend from node 1216 can also be scheduled for testing for the ray; and similarly if node 1220 is found to be a hit for a ray then nodes 1244 to 1250 which descend from node 1220 can also be scheduled for testing for the ray. In some examples, if a ray finds an intersection (i.e. a hit) in the leaf nodes descending from node 1208 then the nodes descending from nodes 1210 and 1206 do not need to be tested. In this way, delaying the portions of the tree in the upper levels of the hierarchy (due to the depth first traversal of the upper levels) can reduce the number of intersection tests that are performed for early exiting rays (i.e. rays that find an intersection in nodes of the hierarchy which are tested near the start of the intersection testing, e.g. in nodes descending from node 1208 in the example shown in FIG. 12).

In the examples described above the intersection testing logic 506 traverses the upper levels of the hierarchical acceleration structure according to a depth-first traversal technique which uses a metric to determine an order in which to descend nodes of the hierarchical acceleration structure. The metric is chosen so that more appropriate nodes are descended first. In this way, the metric can be used to determine respective prioritisations for descending particular nodes. As described above, the metric may comprise a distance metric component. In some examples the metric may, additionally or alternatively, be based on factors other than distance. For example, in order to determine lighting effects within a scene a ray tracing system can trace occlusion rays between an intersection point on a primitive and a light source to determine if the intersection point on the primitive is occluded from the light source. When tracing primary rays the aim is to determine the first piece of geometry that the ray intersects, and as such the distance metric is useful because finding an intersection with a closer piece of opaque geometry means that more distant nodes do not need to be tested. However, when tracing occlusion rays, the aim is to determine whether or not the occlusion ray intersects any geometry before it reaches a light source (i.e. the distance to the occluding object is not necessarily important). Therefore, in these examples, the metric which is used to determine the order in which nodes of the upper levels are descended may comprise an occlusion metric component. The occlusion metric component is arranged to cause nodes with more occluding geometry to be descended before nodes with less occluding geometry. The number of primitives within a node, and the surface area of primitives within a node are two examples of indications of the amount of occluding geometry in a node which may be used to determine the order in which nodes are descended according to the occlusion metric. A ray is more likely to have an intersection in nodes with more occluding geometry than in nodes with less occluding geometry, so nodes with more occluding geometry (even if they are more distant) may be considered "more appropriate" to descend first according to the occlusion metric component.

The metric which is used to determine the order in which upper-level nodes of the hierarchy are descended may comprise more than one of the metric components described herein. As such there may be a trade-off between different metric components when deciding the order in which upper-level nodes are descended. Respective prioritisations for descending particular nodes can be determined based on one or more metric components. For example, for occlusion rays the metric may comprise a distance metric component and an occlusion metric component. Nodes which are closer to the origin of an occlusion ray may represent volumes which span a larger solid angle of a sphere surrounding the occlusion ray origin than nodes which are further from the occlusion ray origin; therefore a ray may be more likely to intersect occluding geometry within closer nodes compared to more distant nodes. As such, a metric based on both the distance metric component and the occlusion metric component may be appropriate for determining the order in which nodes are descended for occlusion rays.

As another example, the metric may comprise an intersection length metric component, which is arranged to cause nodes with which a ray has a longer intersection interval to be descended before nodes with which the ray has a shorter intersection interval. The intersection interval for a ray and a node is the distance between the ray entering the volume represented by the node and the ray exiting the volume. In other words the intersection interval is the distance that the ray travels within the volume represented by the node. The intersection length metric component is a useful metric component for occlusion rays but can also be used for other rays. A ray may be more likely to intersect with geometry within a node if the ray intersects with the node for a greater distance. For example, with reference to FIG. 8$a$, the ray 802 intersects with node 814$_7$ for a greater distance than the ray 802 intersects with node 814$_6$. As such, the intersection length metric component would act to prioritise descending node 814$_7$ ahead of descending node 814$_6$.

In some examples, the intersection testing logic 506 may store indications of the number of intersections which have been identified for different nodes of the one or more upper levels. In these examples, the metric may comprise a previous intersection metric component. The previous intersection metric component is arranged to cause nodes with a greater number of intersections to be descended before nodes with a lower number of intersections as indicated by said stored indications. In this way, the system can learn from the results of previous intersection testing in order to identify which nodes are more likely to contain geometry with which a current ray intersects. In other words, if many previous rays have intersected with geometry within a particular node in the past, then the previous intersection metric component can be used to indicate that a current ray is likely to intersect with geometry within the particular node; whereas if few previous rays have intersected with geometry within a particular node in the past, then the previous intersection metric component can be used to indicate that a current ray is less likely to intersect with geometry within the particular node.

The number of upper levels in the hierarchy (e.g. which are traversed according to the depth-first traversal technique) may be predetermined. In this case, the number of upper levels may be set (e.g. to be three or four) in advance of using the ray tracing system 500 for rendering a scene. The number of upper levels may be set during the design of the ray tracing system 500, such that the number is fixed.

In other examples, when the processing module 504 builds the acceleration structure it may have flexibility in selecting an appropriate number of levels which are to be classed as upper levels, e.g. a number of levels of the hierarchy which are built according to the spatial subdivision structure. In particular, the acceleration structure building logic 522 may determine the number of upper levels of nodes which are to be defined according to the spatial subdivision structure, and cause an indication of the determined number of levels to be stored, e.g. with the acceleration structure in the acceleration structure store 512. The acceleration structure building logic 522 may determine the number of upper levels of nodes based on the spatial coverage of the primitives in the 3-D scene. For example, if the primitives are uniformly distributed over the scene then the number of upper levels of nodes may be determined to be greater than if the primitives are very non-uniformly distributed over the scene. As described above, a spatial subdivision structure works well for uniformly distributed primitives, but for non-uniformly distributed geometry, spatial subdivision structures might not perform as well as bounding volume structures.

Increasing the number of upper levels in the hierarchical acceleration structure allows for greater efficiencies to be achieved by not descending into nodes of the hierarchy representing occluded regions in the scene. This reduces the number of intersection tests which are performed. However, increasing the number of upper levels in the hierarchical acceleration structure reduces the number of lower levels of the hierarchical acceleration structure which therefore reduces the opportunities for improving the parallel processing efficiency by gathering rays together into packets to be processed together. So there is a trade-off to be considered when deciding the number of upper levels in the hierarchy.

The intersection testing logic 506 can retrieve the stored indication of the number of upper levels in order to determine how best to traverse the acceleration structure (e.g. to determine how many levels to traverse according to the depth-first traversal technique).

In the examples described above, the upper levels of the hierarchy are defined according to a spatial subdivision structure and are traversed according to a depth-first traversal technique; whilst the lower levels of the hierarchy are defined according to a bounding volume structure and are traversed according to a breadth-first technique. In other examples, the "upper levels" are not necessarily defined in the same way for determining: (i) whether the nodes are built according to a spatial subdivision structure or a bounding volume, or (ii) whether the nodes a traversed according to a depth-first traversal technique or based on a breadth-first traversal technique. In some examples, the hierarchy may have a different structure to the structure described above (e.g. it may have a uniform structure), but the traversal may still be based on a depth-first traversal technique for one or more upper levels of the hierarchy and based on a breadth-first traversal technique for one or more lower levels of the hierarchy. Furthermore, in some examples, the traversal technique could be different to that described above (e.g. a consistent traversal technique may be applied for all levels of the hierarchy), but the hierarchical acceleration structure may still have the hybrid structure described above wherein one or more upper levels of the hierarchy are defined according to a spatial subdivision structure and one or more lower levels of the hierarchy are defined according to a bounding volume structure. In particular, the hybrid hierarchy structure for the upper and lower parts of the hierarchy has benefits in itself, even if the traversal technique is different to that described above. Spatial subdivision structures tend to enable higher "quality" (i.e. fewer node tests) hierarchies at the cost of creating extra nodes through primitive splitting/binning. Object partitioned hierarchies (e.g. BVHs) tend to create fewer nodes but there can be redundant spatial overlap between them. This is worse in terms of the number of node tests that are performed, but the reduced node count makes it easier to gather coherence on, since there are fewer unique nodes in flight at one time. A spatial subdivision structure is used in the upper levels to minimise the intersection tests where node count or coherency is not an issue. However, in the lower levels the choice of a bounding volume hierarchy (BVH) structure over a spatial subdivision structure helps to reduce the total number of nodes (where the number of nodes is already high), and synergises with the breadth first style traversal to increase coherence where it is needed most.

Figure 13:
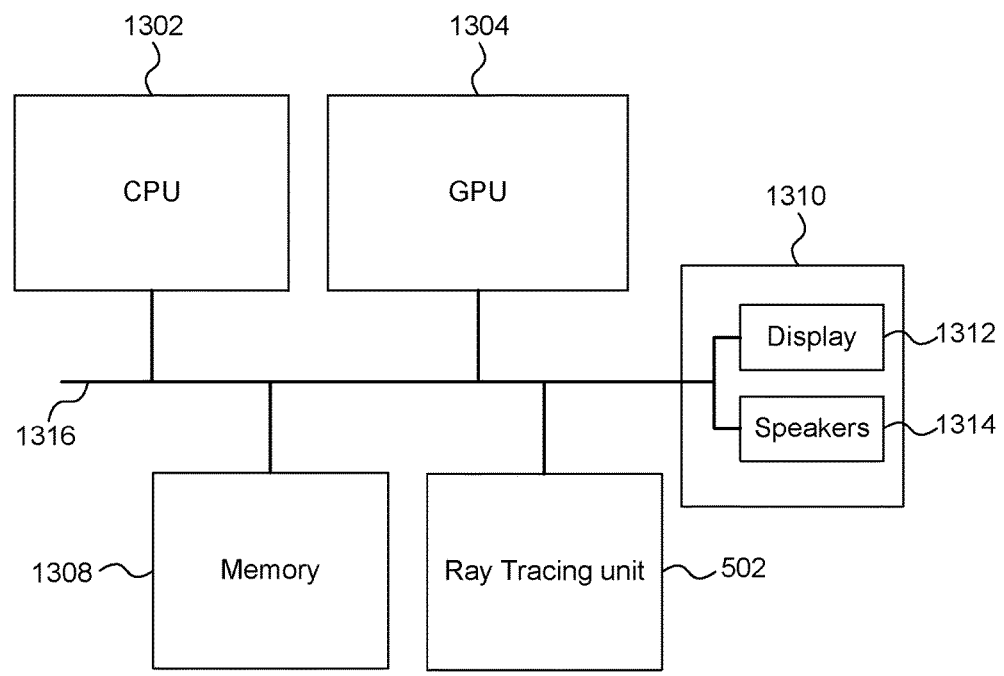
FIG. 13 shows a computer system in which a ray tracing unit is implemented.

FIG. 13 shows a computer system in which the ray tracing systems described herein may be implemented. The computer system comprises a CPU 1302, a GPU 1304, the ray tracing unit 502, a memory 1308 and other devices 1310, such as a display 1312 and speakers 1314. The components of the computer system can communicate with each other via a communications bus 1316. The data stores 510, 512, 514, 516 and 518 may be implemented as part of the memory 1308.

The ray tracing system 500 of FIG. 5 is shown as comprising a number of functional blocks. This is schematic only and is not intended to define a strict division between different logic elements of such entities. Each functional block may be provided in any suitable manner. It is to be understood that intermediate values described herein as being formed by a ray tracing system need not be physically generated by the ray tracing system at any point and may merely represent logical values which conveniently describe the processing performed by the ray tracing system between its input and output.

The ray tracing systems described herein may be embodied in hardware on an integrated circuit. The ray tracing systems described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a ray tracing unit configured to perform any of the methods described herein, or to manufacture a ray tracing unit comprising any apparatus described herein. An integrated circuit definition dataset may be, for example, an integrated circuit description.

Therefore, there may be provided a method of manufacturing, at an integrated circuit manufacturing system, a ray tracing unit (or ray tracing system, or any component thereof) as described herein. Furthermore, there may be provided an integrated circuit definition dataset that, when processed in an integrated circuit manufacturing system, causes the method of manufacturing a ray tracing unit to be performed.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a ray tracing unit will now be described with respect to FIG. 14.

Figure 14:
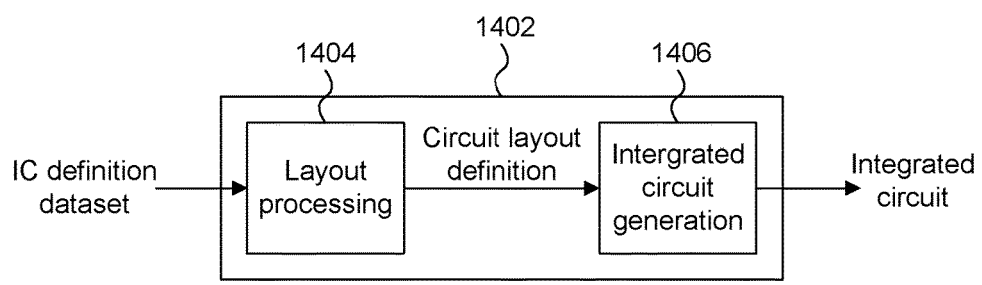
FIG. 14 shows an integrated circuit manufacturing system for generating an integrated circuit embodying a ray tracing unit or a processing module.

FIG. 14 shows an example of an integrated circuit (IC) manufacturing system 1402 which is configured to manufacture a ray tracing unit as described in any of the examples herein. In particular, the IC manufacturing system 1402 comprises a layout processing system 1404 and an integrated circuit generation system 1406. The IC manufacturing system 1402 is configured to receive an IC definition dataset (e.g. defining a ray tracing unit as described in any of the examples herein), process the IC definition dataset, and generate an IC according to the IC definition dataset (e.g. which embodies a ray tracing unit as described in any of the examples herein). The processing of the IC definition dataset configures the IC manufacturing system 1402 to manufacture an integrated circuit embodying a ray tracing unit as described in any of the examples herein.

The layout processing system 1404 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1404 has determined the circuit layout it may output a circuit layout definition to the IC generation system 1406. A circuit layout definition may be, for example, a circuit layout description.

The IC generation system 1406 generates an IC according to the circuit layout definition, as is known in the art. For example, the IC generation system 1406 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1406 may be in the form of computer-readable code which the IC generation system 1406 can use to form a suitable mask for use in generating an IC.

The different processes performed by the IC manufacturing system 1402 may be implemented all in one location, e.g. by one party. Alternatively, the IC manufacturing system 1402 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a ray tracing unit without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 14 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 14, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:
1. A computer-implemented method of rendering an image of a 3D scene using a ray tracing system, the method comprising:
 performing intersection testing comprising traversing a hierarchical acceleration structure, such that there is a transition in traversal behaviour part-way down the hierarchical acceleration structure, by:

traversing one or more upper levels of nodes of the hierarchical acceleration structure according to a first traversal technique; and traversing one or more lower levels of nodes of the hierarchical acceleration structure according to a second traversal technique, wherein the second traversal technique is different to the first traversal technique; and using results of said traversing the hierarchical acceleration structure to render the image of the 3D scene.

2. The method of claim 1, wherein said first traversal technique is a depth-first traversal technique, and wherein said second traversal technique is not a depth-first traversal technique.

3. The method of claim 1, wherein the second traversal technique is based on a breadth-first traversal technique, wherein intersection testing of nodes with rays is scheduled based on availability of node data and ray data.

4. The method of claim 1, wherein said one or more upper levels of nodes are at the top of the hierarchical acceleration structure, and wherein said one or more lower levels of nodes are below said one or more upper levels in the hierarchical acceleration structure.

5. The method of claim 1, wherein said traversing one or more upper levels of nodes of the hierarchical acceleration structure according to the depth-first traversal technique comprises using a metric to determine an order in which to descend nodes of the hierarchical acceleration structure.

6. The method of claim 5, wherein the metric is chosen so that more appropriate nodes are descended before less appropriate nodes.

7. The method of claim 5, wherein the metric comprises a distance metric component, wherein the distance metric component is arranged to cause closer nodes to be descended before more distant nodes, and wherein a Digital Differential Analyzer (DDA) technique is used to determine the ordering in which the nodes of the one or more upper levels are descended according to the distance metric component.

8. The method of claim 5, wherein the metric comprises an occlusion metric component, wherein the occlusion metric component is arranged to cause nodes with more occluding geometry to be descended before nodes with less occluding geometry, wherein the occlusion metric component is used to traverse the one or more upper levels of nodes of the hierarchical acceleration structure for occlusion rays.

9. The method of claim 5, wherein the metric comprises an intersection length metric component, wherein the intersection length metric component is arranged to cause nodes with which a ray has a longer intersection interval to be descended before nodes with which the ray has a shorter intersection interval.

10. The method of claim 5, wherein indications of the number of intersections are stored for different nodes of the one or more upper levels, and wherein the metric comprises a previous intersection metric component, wherein the previous intersection metric component is arranged to cause, based on said indications, nodes with a greater number of intersections to be descended before nodes with a lower number of intersections.

11. A ray tracing unit configured to render an image of a 3D scene, the ray tracing unit comprising:

intersection testing logic configured to access a hierarchical acceleration structure and to traverse the hierarchical acceleration structure, for the purposes of intersection testing, such that there is a transition in traversal behaviour part-way down the hierarchical acceleration structure, by:

traversing one or more upper levels of nodes of the hierarchical acceleration structure according to a first traversal technique; and traversing one or more lower levels of nodes of the hierarchical acceleration structure according to a second traversal technique, wherein the second traversal technique is different to the first traversal technique; and processing logic configured to use results of traversing the hierarchical acceleration structure to render the image of the 3D scene.

12. The ray tracing unit of claim 11, wherein said first traversal technique is a depth-first traversal technique, and wherein said second traversal technique is not a depth-first traversal technique.

13. The ray tracing unit of claim 11, wherein the second traversal technique is based on a breadth-first traversal technique, wherein the intersection testing logic comprises scheduling logic configured to schedule intersection testing of nodes with rays based on availability of node data and ray data, and wherein the intersection testing logic further comprises:

collection gathering logic configured to gather intersection testing work items together into collections to be executed in parallel, wherein an intersection testing work item identifies a ray and a node which are to be tested for intersection; and one or more execution units configured to execute collections of intersection testing work items in parallel;

wherein the scheduling logic is configured to schedule collections of work items for execution by the one or more execution units based on the numbers of work items in the collections.

14. The ray tracing unit of claim 11, wherein the one or more lower levels of nodes represent multiple sub-hierarchies within the hierarchical acceleration structure, and wherein the root nodes of the sub-hierarchies are represented as leaf nodes within the one or more upper levels of the hierarchical acceleration structure, such that the depth-first traversal of the one or more upper levels of nodes of the hierarchical acceleration structure determines an order in which the sub-hierarchies are selected for traversal.

15. The ray tracing unit of claim 14, wherein the intersection testing logic is configured to traverse the one or more lower levels of nodes of the hierarchical acceleration structure according to the second traversal technique by grouping intersection testing work items for nodes within a subset of one or more of the sub-hierarchies together into collections to be executed in parallel, wherein an intersection testing work item identifies a ray and a node which are to be tested for intersection, wherein the subset comprises a single sub-hierarchy, wherein the intersection testing logic is configured to traverse the hierarchical acceleration structure by sequentially selecting the sub-hierarchies to be traversed, wherein the order in which the sub-hierarchies are selected is determined by the depth-first traversal of the one or more upper levels of nodes of the hierarchical acceleration structure.

16. The ray tracing unit of claim 14, wherein the intersection testing logic is configured to traverse the one or more lower levels of nodes of the hierarchical acceleration structure according to the second traversal technique by grouping intersection testing work items for nodes within a subset of one or more of the sub-hierarchies together into collections to be executed in parallel, wherein an intersection testing work item identifies a ray and a node which are to be tested for intersection, wherein the subset comprises a plurality of sub-hierarchies, wherein the intersection testing logic is configured to traverse the one or more lower levels of nodes of the hierarchical acceleration structure by traversing a sequence of groups of sub-hierarchies.

17. The ray tracing unit of claim 11, wherein the one or more upper levels of nodes of the hierarchical acceleration structure are defined according to a first structure, and wherein the one or more lower levels of nodes of the hierarchical acceleration structure are defined according to a second structure, wherein the first structure is different to the second structure.

18. The ray tracing unit of claim 11, wherein the one or more upper levels of nodes of the hierarchical acceleration structure are defined according to a spatial subdivision structure, wherein the spatial subdivision structure is: (i) a grid structure, (ii) a multi-level grid structure, (iii) an octree structure, or (iv) a space partitioning structure, wherein the space partitioning structure is a k-d tree.

19. The ray tracing unit of claim 11, wherein the one or more lower levels of nodes of the hierarchical acceleration structure are defined according to a bounding volume structure, wherein the bounding volume structure is defined with reference to an octree structure.

20. A non-transitory computer readable storage medium having encoded thereon computer readable code configured to cause a method of rendering an image of a 3D scene to be performed in a ray tracing system when the code is run, wherein the method comprises:

performing intersection testing comprising traversing a hierarchical acceleration structure, such that there is a transition in traversal behaviour part-way down the hierarchical acceleration structure, by:
traversing one or more upper levels of nodes of the hierarchical acceleration structure according to a first traversal technique; and
traversing one or more lower levels of nodes of the hierarchical acceleration structure according to a second traversal technique, wherein the second traversal technique is different to the first traversal technique; and
using results of said traversing the hierarchical acceleration structure to render the image of the 3D scene.

\* \* \* \* \*